United States Patent [19]
Krolik

[11] 3,946,321
[45] Mar. 23, 1976

[54] DIGITAL ENCODER
[75] Inventor: Kenneth J. Krolik, San Jose, Calif.
[73] Assignee: Motorola, Inc., Chicago, Ill.
[22] Filed: Oct. 15, 1974
[21] Appl. No.: 514,718

[52] U.S. Cl. .................................. 328/25; 328/39
[51] Int. Cl.² .................... H03B 19/00; H03K 21/00
[58] Field of Search .............................. 328/25, 39

[56] References Cited
UNITED STATES PATENTS

| | | | |
|---|---|---|---|
| 3,063,045 | 11/1962 | Bunch | 340/351 |
| 3,327,304 | 6/1967 | Willard | 340/351 |
| 3,495,219 | 2/1970 | Clapp et al. | 340/351 |
| 3,551,826 | 12/1970 | Sepe | 328/25 |
| 3,657,658 | 4/1972 | Kubo | 328/39 |

Primary Examiner—Harold A. Dixon
Attorney, Agent, or Firm—James W. Gillman; Eugene A. Parsons

[57] ABSTRACT

An oscillator with a ceramic resonator in the feedback circuit for providing a stable continuous signal to a programmable divider each time an enable signal is applied to the oscillator, a read-only memory connected to the programmable divider and operated by timing means, including a counter and a clock, which sequentially switches the memory to cause the programmable divider to divide the output of the oscillator by a different divisor to provide a predetermined sequence of signals, each having a desired frequency.

4 Claims, 3 Drawing Figures

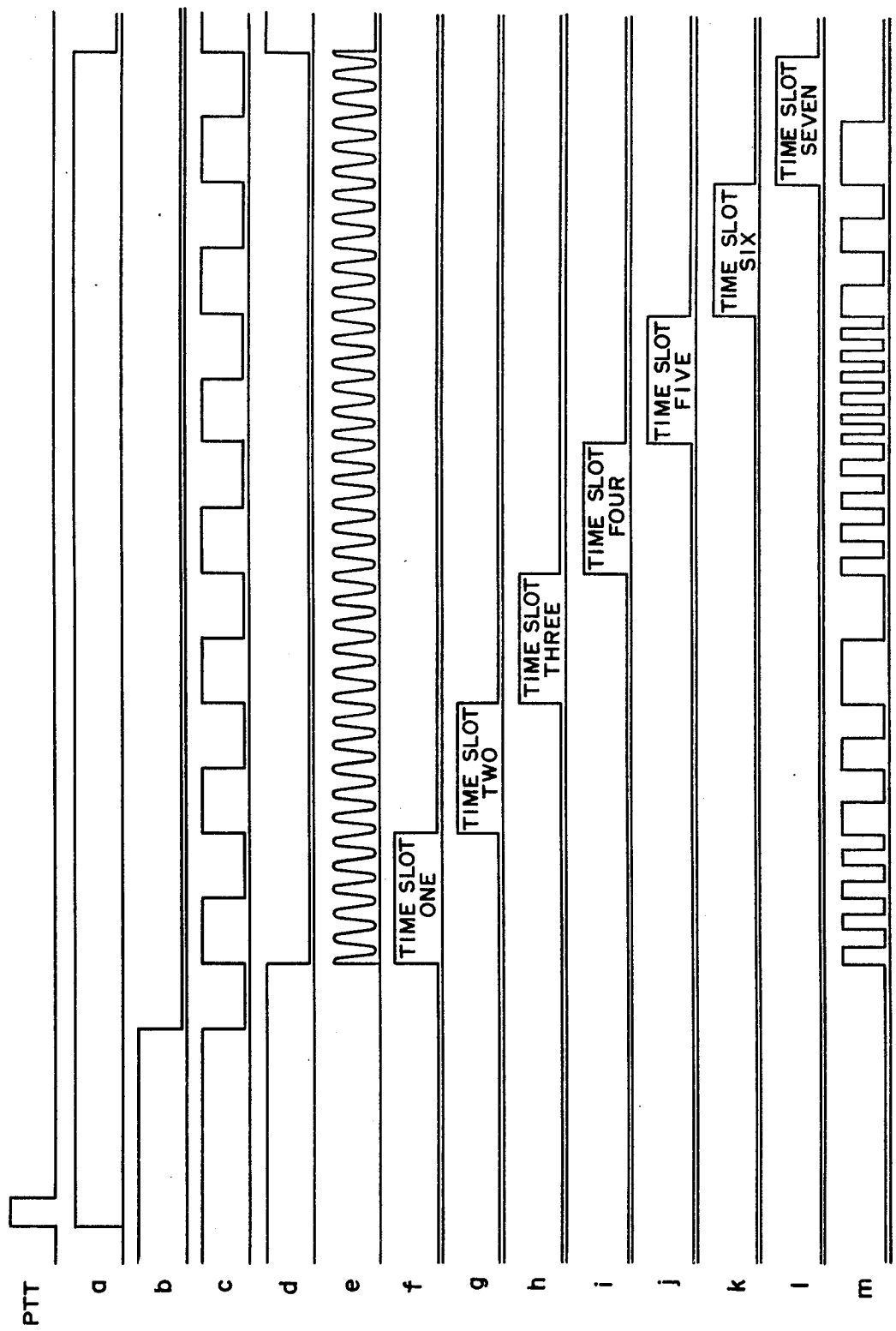

DIGITAL ENCODER

BACKGROUND OF THE INVENTION

1. FIELD OF THE INVENTION

In the electronics field there are a great many uses for digital encoders and especially digital encoders which can provide a sequence of signals each having a predetermined frequency. Encoders of the type herein described are especially useful in communications systems where an address is transmitted prior to a message, which address is composed of a series of signals each with a predetermined frequency, so that only a desired one of a plurality of receivers will receive the transmitted message. The present encoder is useful in any system wherein it is desired to convert specific numbers or the like to signals of a predetermined frequency.

2. DESCRIPTION OF THE PRIOR ART

In prior art systems, when it is desired to provide a sequence of signals having different frequencies, a programmable variable frequency oscillator, frequency synthesizer, a plurality of oscillators, or the like are utilized. Each of these systems is relatively expensive and complicated and may increase RF problems and the like because of oscillator noise, less RF sensitivity and other factors.

BRIEF DESCRIPTION OF THE DRAWINGS

Referring to the drawings, wherein like characters indicate like parts throughout the figures:

FIG. 3 is a chart illustrating the time sequence of various signals available at designated points in FIG. 1.

DESCRIPTION OF THE PREFERRED EMBODIMENT

Figure 1:
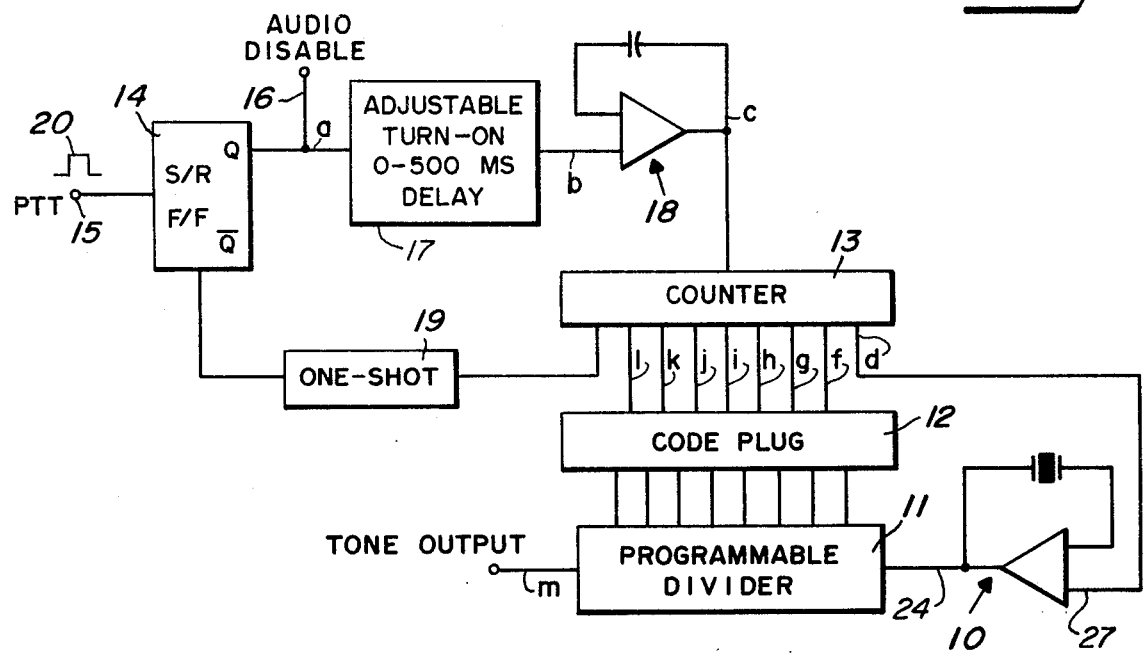
FIG. 1 is a block diagram of an embodiment of the present invention connected for use in a two-way communications system.

Referring specifically to FIG. 1, the numeral 10 generally designates a reference oscillator, which will be described in more detail in conjunction with FIG. 2. Reference oscillator 10 supplies a signal to a programmable divider 11 the output of which is a predetermined sequence of tones or signals each having a desired frequency. The programmable divider 11 can be similar to the programmable divider, illustrated as counter 13, described in U.S. Pat. No. 3,729,688, entitled "Oscillator With Switchable Filter Control Voltage Input for Rapidly Switching to Discreet Frequency Outputs" and assigned to the same assignee as the present application. The programmable divider 11 has a plurality of inputs (in the present embodiment 8), each of which is connected to an output of memory means, which in this embodiment is a read-only memory (ROM) 12. ROM 12 operates as a code plug to actuate the desired divisor in the programmable divider 11. The desired sequence of operation of ROM 12 is provided by a counter 13 which supplies a plurality (in this embodiment 7) of sequential activating signals to the ROM 12. The counter 13 and code plug 12 can be similar to the counter 21 and code plug 24 (see FIG. 3) described in U.S. Pat. No. 3,882,466, entitled "Switchable Frequency Tone Detector With Electronically Controlled Code Plug and BCD Converter", and assigned to the same assignee as the present application.

The counter 13 also supplies an enable signal to an input of the reference oscillator 10. Further, at the end of a sequence an output of the counter 13 supplies a reset signal, such as that developed by the one-shot 19, to a set/reset flip-flop 14. Flip-flop 14 is set by a pulse signal applied to an input terminal 15 by some means (not shown), such as a push-to-talk switch (PTT). The output of the flip-flop 14 is applied to a terminal 16, which may be connected to an audio disable circuit or the like, and through a delay circuit 17 to an input of a sequence oscillator generally designated 18. The output of the sequence oscillator serves as a clock signal for the counter 13.

Figure 2:
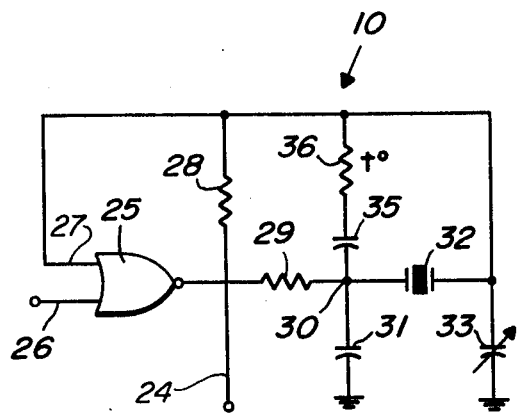
FIG. 2 is a schematic diagram of a portion of FIG. 1.

Referring to FIG. 2, the reference oscillator 10 utilized in the present embodiment is illustrated. While it should be understood that other reference oscillators might be utilized, the oscillator illustrated in FIG. 2 is utilized because of several advantages over other known oscillators, including simplicity, the ability to readily include this oscillator in an IC circuit, and stability with less expense. Reference oscillator 10 includes a logic gate amplifier 25, which in this embodiment is a "NOR" gate, having a first input 26, adapted to receive an enable signal thereon, and a second input 27. It should be understood that logic gates other than a "NOR" gate can be utilized if desired and only minor differences to the circuit will be required to compensate for the different signals required and provided. The output of the logic gate amplifier 25 is connected through a resistor 28 to the input 27, through a second resistor 29 to a junction 30 and to an output terminal 24. The junction 30 is connected through a capacitor 31 to ground and through a ceramic resonator 32 to the input 27. The input 27 is also connected through a variable capacitor 33 to ground. Resistors 28 and 29, capacitors 31 and 33 and ceramic resonator 32 form a pi feedback network having attenuation and phase characteristics sufficient for providing sustained oscillations whenever an enable signal is applied to the input 26. In the present embodiment the various components have the following values. Resistor 28 is 10 megohms, resistor 29 is 12 K, capacitor 31 is 500 pf, capacitor 33 is adjusted to approximately 100 pf and ceramic resonator 32 has a resonant frequency of approximately 467 kHz. With these exemplary values the reference oscillator 10 oscillates at approximately 484.5 kHz. If desired, a capacitor 35 and thermistor 36 may be connected in series between the junction 30 and the input 27 to provide temperature compensation.

Because the ceramic resonator 32 is used in the reference oscillator 10 instead of a quartz crystal or the like, the reference oscillator 10 is less expensive but also less stable. An RC (resistor-capacitor) oscillator using C-MOS gates typically has a stability of plus or minus 2% whereas the reference oscillator 10 typically has a stability on the order of plus or minus 0.4%. The cost of the ceramic resonator 32 is approximately 10% to 20% of the cost of a comparable crystal. Thus, the reference oscillator 10 fills a gap between high stability crystal oscillators and relatively inexpensive RC oscillators. Further, the reference oscillator 10 is simple to construct since it uses a linearly biased C-MOS logic gate 25 as an amplifier.

Referring to FIG. 3, a chart is illustrated showing the sequence of signals present at various designated points $a$ through $m$ on the block diagram of FIG. 1. When the push-to-talk switch is actuated a signal, such as pulse 20, is supplied at the terminal 15 to set flip-flop 14. The flip-flop 14 remains set until a pulse is applied to the reset input thereof. The output of flip-flop 14 is applied to terminal 16 to disable the microphone audio during the transmission and is also applied through the delay circuit 17 to enable the sequence oscillator 18. The delay circuit 17 is an adjustable turn-on, zero to 500 millisecond, delay and used to provide the correct timing between the present digital encoder and the remaining communications system. The delayed pulse enables the sequence oscillator 18, which in turn supplies a series of clock pulses at a predetermined rate, or in this embodiment, at a 25 hertz rate, to the counter 13. The first 25 kHz. clock pulse applied to the counter 13 produces a d-c level transition (see signal information at point $d$), which is then applied to the input of the reference oscillator 10 to enable the oscillator so that the reference oscillator 10 begins to supply a 484.5 kHz. signal to the input of the programmable divider 11 (see the signal at point $e$). The first clock pulse also causes the first output of the counter 13 to cause the ROM 12 to supply a first activating signal to the programmable divider 11 and activate a first predetermined divisor. The second clock pulse provides a signal on the second output of the counter 13 which supplies a signal to the ROM 12 removing the first activating signal and supplying a second activating signal to the programmable divider 11. Thus, the first divisor is removed from the circuit and a second divisor is inserted in the circuit until the third clock pulse is applied to the counter 13. The time relationship between the clock pulses at point $c$, the pulses applied by counter 13 to ROM 12 at points $f$ through $l$, and the frequencies or tones available at the output (point $m$) of the programmable divider 11 are all illustrated in FIG. 3. Following the transmission of the final signal $l$ from counter 13, an appropriate signal is supplied from the counter 13 to the reset input of flip-flop 14 to place the entire circuit in an inactive condition until the push-to-talk switch is again operated.

Thus, a relatively simple but accurate digital encoder is described which produces a predetermined sequence of desired tones. It will, of course, be understood that the counter 13, oscillator 18 and flip-flop 14 operate as a timing means in the present embodiment but other circuits might be utilized to activate the ROM 12, or whatever other memory means might be utilized, so that the programmable divider 11 is operated in the predetermined sequence.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. A digital encoder comprising:
   a. an oscillator including a two input logic gate amplifier and a ceramic resonator in a phase changing feedback network connected between an input and an output of said logic gate amplifier and providing a continuous signal during proper energization thereof:
   b. a programmable divider connected to receive the continuous signal from said oscillator and provide a signal at an output which has a frequency equal to the frequency of the continuous signal divided by a predetermined divisor, said divider having a plurality of inputs for receiving different signals thereon representative of different predetermined divisors;
   c. memory means including a read-only memory code plug having a plurality of outputs connected to the plurality of inputs of said programmable divider and a plurality of corresponding inputs, said memory means providing signals on each of the plurality of outputs representative of a different predetermined divisor in response to an activating signal being applied to the corresponding input; and
   d. timing means connected to the plurality of inputs of said memory means for providing activating signals thereto in a predetermined sequence.

2. A digital encoder as claimed in claim 1 wherein the timing means includes a counter with a plurality of outputs connected to the inputs of the memory means and a source of clock pulses connected to an input of said counter.

3. A digital encoder as claimed in claim 2 wherein an output of the counter is connected to one input of the logic gate amplifier for enabling the oscillatory signal to be applied to said programmable divider during the time that activating signals are being applied to inputs of the memory means.

4. A digital encoder comprising:
   a. an oscillator including a logic gate amplifier having two inputs and an output, one of said inputs being adapted to receive an enabling signal thereon, a feedback network connected between the output and the other input of said logic gate amplifier and having attenuation and phase characteristics sufficient for providing sustained oscillations when an enabling signal is applied to the one input of said logic gate amplifier, and said feedback network including a pi network having a ceramic resonator therein providing a continuous signal during proper energization thereof;
   b. a programmable divider connected to receive the continuous signal from said oscillator and provide a signal at an output which has a frequency equal to the frequency of the continuous signal divided by a predetermined divisor, said divider having a plurality of inputs for receiving different signals thereon representative of different predetermined divisors;
   c. memory means having a plurality of outputs connected to the plurality of inputs of said programmable divider and a plurality of corresponding inputs, said memory means providing signals on each of the plurality of outputs representative of a different predetermined divisor in response to an activating signal being applied to the corresponding input; and
   d. timing means connected to the plurality of inputs of said memory means for providing activating signals thereto in a predetermined sequence.

* * * * *